(12) United States Patent
Hathaway et al.

(10) Patent No.: US 6,425,110 B1
(45) Date of Patent: Jul. 23, 2002

(54) INCREMENTAL DESIGN TUNING AND DECISION MEDIATOR

(75) Inventors: David J. Hathaway, Underhill Center, VT (US); Anthony D. Drumm, Rochester, MN (US); Peter J. Osler, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/213,675

(22) Filed: Dec. 17, 1998

(51) Int. Cl.[7] .......................... G06F 17/50; G06F 9/45
(52) U.S. Cl. ................................ 716/2; 716/6; 716/4
(58) Field of Search ................................ 716/2, 6, 4

(56) References Cited

U.S. PATENT DOCUMENTS

| | | | |
|---|---|---|---|
| 5,003,487 A | * | 3/1991 | Drumm et al. ............. 364/489 |
| 5,508,937 A | | 4/1996 | Abato et al. ................ 364/488 |
| 5,636,372 A | * | 6/1997 | Hathaway et al. .......... 395/555 |
| 5,740,067 A | | 4/1998 | Hathaway .................... 364/489 |
| 5,751,593 A | * | 5/1998 | Pullela et al. ............... 364/488 |
| 5,825,661 A | * | 10/1998 | Drumm ....................... 364/491 |
| 5,983,277 A | * | 11/1999 | Heile et al. ................. 709/232 |
| 6,099,580 A | * | 8/2000 | Boyle et al. .................... 716/7 |

* cited by examiner

Primary Examiner—Caridad Everhart
Assistant Examiner—A. M. Thompson
(74) Attorney, Agent, or Firm—Ira D. Blecker

(57) ABSTRACT

A method for analyzing and optimizing a design, such as a circuit design, which relates to the application of at least one optimization procedure, evaluating the benefit and net cost of the optimization procedure and then through the checkpoint manager, recording and reversing changes of the design. The execution and reversal of multiple optimizations may occur in a trial mode followed by evaluation of the executed and reversed designs and then the reinstatement of the best optimization.

41 Claims, 6 Drawing Sheets

INCREMENTAL DESIGN TUNING AND DECISION MEDIATOR

BACKGROUND OF THE INVENTION

The present invention generally relates to a method for applying and deciding between several alternative optimizations to a design and the selection of the preferred alternative being determined by an evaluator which compares the results of the different optimization alternatives and more particularly relates to the application of the method to electronic design automation.

In deep sub-micron integrated circuit design, design domains such as logic synthesis and placement which have traditionally been optimized separately are interacting to such an extent that independent considerations of these domains is no longer possible. In addition to traditional design metrics such as area (e.g., placement and wiring, floor planning and the like) and timing, there are also new issues which affect the functionality and/or optimality of designs such as noise, electromigration and power.

All of these trends require much tighter integration of design and analysis tools from different domains than has been seen in the past. This in turn requires that design analysis and optimization tools operate incrementally. Despite this need for the tools to be integrated and incremental, they must remain modular and separable to manage the complexity of the design system, to restrict the expertise needed to develop tools for particular design domains, and to allow for replacement of tools in different domains as better techniques become available.

Timing analysis is a well-known tool. Timing analysis can be in late mode (making sure signals get where they need to on time) or early mode (making sure signals are held at a stable state long enough). Timing generally refers to late mode unless early mode is specifically stated. Late mode arrival time is the latest time that a signal arrives (i.e., becomes stable) at some point. Late mode required arrival time is the time a signal needs to arrive at some point in order to meet all timing requirements. Late mode slack is required arrival time minus arrival time. Early mode arrival time is the earliest a signal will become unstable at some point. Early mode required arrival time is the latest time that a signal needs to be held stable at some point in order to meet all timing requirements. Early mode slack is arrival time minus required arrival time. In both cases, slack is defined so that a negative slack value indicates a timing problem.

Abato et al. U.S. Pat. No. 5,508,937, the disclosure of which is incorporated by reference herein, discloses an incremental timing analyzer which produces slack values at any circuit pin in the design.

Hathaway U.S. Pat. No. 5,740,067, the disclosure of which is incorporated by reference herein, discloses an incremental analyzer which computes the total skew cost for a clock tree.

For efficiency, incremental analysis tools should employ lazy evaluation. This means that no analysis or reanalysis is done until requested. Thus, instead of doing a lot of computation up front, the computation is done only when the information is needed. When computing an updated value an analyzer may employ incomplete lazy evaluation if it can determine that only a subset of pending changes can affect the requested value.

All of these concerns require a different tool integration architecture than has been used in the past; such an architecture defines the manner in which the various analysis and optimization tools interact and is the subject of the present invention.

An important purpose of the present invention in modularizing incremental design tools is to separate design modification tools from the tools which analyze the results of those modifications. Such separation provides the following benefits:

- It allows use of a single design optimization tool in different contexts with different cost functions and considerations;
- Within one stage of design (e.g., post-placement) it allows use of the same evaluation functions for many different design optimizations, ensuring consistency in the objectives during that stage; and
- It allows evaluation of a series of optimizations performed by different independent design tools, e.g., buffer insertion and buffer placement. This is important if each of these separate optimizations is not complete in and of itself, since an incomplete optimization cannot be meaningfully evaluated.

BRIEF SUMMARY OF THE INVENTION

One aspect of the invention relates to a method for analyzing and optimizing a design, the method comprising the steps of:

(a) providing a model representing a design being optimized;

(b) providing a checkpoint manager for recording changes of the design between selected reference points, the selected reference points being an initial checkpoint and a final checkpoint;

(c) providing an evaluator for determining the net cost and benefit of the changes between the selected reference points;

(d) applying a first optimization procedure to cause at least one change in the design; and (e) evaluating the at least one design change to determine the net cost and benefit of the change, wherein if the at least one design change results in improved net cost and benefit, then the design is optimized.

A second aspect of the invention relates to a method for analyzing and optimizing a design, the method comprising the steps of:

(a) providing a model representing a design being optimized;

(b) providing a checkpoint manager for recording changes of the design between selected reference points, the selected reference points being an initial checkpoint and a final checkpoint;

(c) providing an evaluator for determining the net cost and benefit of the changes between the selected reference points;

(d) establishing an initial checkpoint;

(e) applying an optimization procedure to cause at least one change in the design from the initial checkpoint to a second checkpoint;

(f) evaluating the at least one design change resulting from the optimization procedure to determine the net cost and benefit of the change;

(g) returning the design model to the initial checkpoint;

(h) repeating steps (d), (e) and (f);

(i) comparing the net cost and benefit of the optimization procedure just performed with the best net cost and benefit of any previous optimization procedure performed to result in a best net cost and benefit of the optimization procedures performed thus far, and retaining the best net cost and benefit of the optimization procedures performed thus far;

(j) returning the design model to the initial checkpoint;

(k) repeating steps (g), (h) and (i) a predetermined number of times; and (l) returning the design model to its state at the checkpoint of the optimization procedure that has resulted in the best net cost and benefit or to its state at the initial checkpoint in the event that no optimization procedure improved the design model so that the design is optimally changed to a new design.

A third aspect of the invention relates to a method for analyzing and optimizing a design, the method comprising the steps of:

(a) providing a model representing a design being optimized;

(b) providing a checkpoint manager for recording changes of the design between selected checkpoint reference points;

(c) providing an evaluator for determining the net cost and benefit of the changes between the selected reference points;

(d) establishing and retaining a checkpoint;

(e) applying an optimization procedure to cause at least one change in the design from the previously retained checkpoint to a final checkpoint;

(f) evaluating the at least one design change resulting from the optimization procedure to determine the net cost and benefit of the change;

(g) comparing the net cost and benefit of the optimization procedure just performed with the net cost and benefit of the previous optimization procedure performed associated with the previous retained checkpoint, and retaining the best net cost and benefit and final checkpoint of the optimization procedure just performed if there is an improved net cost and benefit;

(h) returning the design model to the immediately previous retained checkpoint;

(i) repeating steps (e) to (h) a predetermined number of times; and (j) returning the design model to its state at the checkpoint of the optimization procedure that has resulted in the last net cost and benefit retained or to its state at the initial checkpoint in the event that no optimization procedure improved the design model so that the design is optimally changed to a new design.

A fourth aspect of the invention relates to a computer program product comprising:

(a) a computer usable medium having computer readable program code means embodied therein for causing a design to be analyzed and optimized, the computer readable program code means in the computer program product comprising:

(b) computer readable program code means for causing a computer to effect a model representing a design being optimized;

(c) computer readable program code means for causing a computer to effect a checkpoint manager for recording changes of the design between selected reference points, the selected reference points being an initial checkpoint and a final checkpoint;

(d) computer readable program code means for causing a computer to effect an evaluator for determining the net cost and benefit of the changes between the selected reference points;

(e) computer readable program code means for causing a computer to effect the application of a first optimization procedure to cause at least one change in the design; and (f) computer readable program code means for causing a computer to effect the evaluation of the at least one design change to determine the net cost and benefit of the change, wherein if the at least one design change results in improved net cost and benefit, then the design is optimized.

A fifth aspect of the invention relates to a computer program product comprising:

(a) a computer usable medium having computer readable program code means embodied therein for causing a design to be analyzed and optimized, the computer readable program code means in the computer program product comprising:

(b) computer readable program code means for causing a computer to effect a model representing a design being optimized;

(c) computer readable program code means for causing a computer to effect a checkpoint manager for recording changes of the design between selected reference points, the selected reference points being an initial checkpoint and a final checkpoint;

(d) computer readable program code means for causing a computer to effect an evaluator for determining the net cost and benefit of the changes between the selected reference points;

(e) computer readable program code means for causing a computer to effect the establishment of an initial checkpoint;

(f) computer readable program code means for causing a computer to effect the application of a first optimization procedure to cause at least one change in the design from the initial checkpoint to a second checkpoint;

(g) computer readable program code means for causing a computer to effect the evaluating the at least one design change resulting from the optimization procedure to determine the net cost and benefit of the change;

(h) computer readable program code means for causing a computer to effect the return of the design model to the initial checkpoint;

(i) computer readable program code means for causing a computer to effect the repetition of (e), (f) and (g);

(j) computer readable program code means for causing a computer to effect the comparison of the net cost and benefit of the optimization procedure just performed with the best net cost and benefit of any previous optimization procedure performed to result in a best net cost and benefit of the optimization procedures performed thus far, and the retention of the best net cost and benefit of the optimization procedures performed thus far;

(k) computer readable program code means for causing a computer to effect the return of the design model to the initial checkpoint;

(l) computer readable program code means for causing a computer to effect the repetition of (h), (i) and (k) a predetermined number of times; and (m) computer readable program code means for causing a computer to effect the returning of the design model to its state at the checkpoint of the optimization procedure that has resulted in the best net cost and benefit or to its state at the initial checkpoint in the event that no optimization procedure improved the design model so that the design is optimally changed to a new design.

A sixth aspect of the invention relates to a computer program product comprising:

(a) a computer usable medium having computer readable program code means embodied therein for causing a design to be analyzed and optimized, the computer readable program code means in the computer program product comprising:

(b) computer readable program code means for causing a computer to effect a model representing a design being optimized;

(c) computer readable program code means for causing a computer to effect a checkpoint manager for recording changes of the design between selected reference points;

(d) computer readable program code means for causing a computer to effect an evaluator for determining the net cost and benefit of the changes between the selected reference points;

(e) computer readable program code means for causing a computer to effect the establishment and retention of a checkpoint;

(f) computer readable program code means for causing a computer to effect the application of an optimization procedure to cause at least one change in the design from the previously retained checkpoint to a final checkpoint;

(g) computer readable program code means for causing a computer to effect the evaluation of the at least one design change resulting from the optimization procedure to determine the net cost and benefit of the change;

(h) computer readable program code means for causing a computer to effect the comparison of the net cost and benefit of the optimization procedure just performed with the net cost and benefit of the previous optimization procedure performed associated with the previous retained checkpoint, and the retention of the best net cost and benefit and final checkpoint of the optimization procedure just performed if there is an improved net cost and benefit;

(i) computer readable program code means for causing a computer to effect the return of the design model to the immediately previous retained checkpoint;

(j) computer readable program code means for causing a computer to effect the repetition of (f) to (i) a predetermined number of times; and (k) computer readable program code means for causing a computer to effect the returning of the design model to its state at the checkpoint of the optimization procedure that has resulted in the last net cost and benefit retained or to its state at the initial checkpoint in the event that no optimization procedure improved the design model so that the design is optimally changed to a new design.

A seventh aspect of the invention relates to a program storage device readable by a machine, tangibly embodying a program of instructions executable by the machine to perform method steps for analyzing and optimizing a design, the method steps comprising the steps of:

(a) providing a model representing a design being optimized;

(b) providing a checkpoint manager for recording changes of the design between selected reference points, the selected reference points being an initial checkpoint and a final checkpoint;

(c) providing an evaluator for determining the net cost and benefit of the changes between the selected reference points;

(d) applying a first optimization procedure to cause at least one change in the design; and (e) evaluating the at least one design change to determine the net cost and benefit of the change, thereby determining if the design change will result in an optimized design.

An eighth aspect of the invention relates to a program storage device readable by a machine, tangibly embodying a program of instructions executable by the machine to perform method steps for analyzing and optimizing a design, the method steps comprising the steps of:

(a) providing a model representing a design being optimized;

(b) providing a checkpoint manager for recording changes of the design between selected reference points, the selected reference points being an initial checkpoint and a final checkpoint;

(c) providing an evaluator for determining the net cost and benefit of the changes between the selected reference points;

(d) establishing an initial checkpoint;

(e) applying an optimization procedure to cause at least one change in the design from the initial checkpoint to a second checkpoint;

(f) evaluating the at least one design change resulting from the optimization procedure to determine the net cost and benefit of the change;

(g) returning the design model to the initial checkpoint;

(h) repeating steps (d), (e) and (f);

(i) comparing the net cost and benefit of the optimization procedure just performed with the best net cost and benefit of any previous optimization procedure performed to result in a best net cost and benefit of the optimization procedures performed thus far, and retaining the best net cost and benefit of the optimization procedures performed thus far;

(j) returning the design model to the initial checkpoint;

(k) repeating steps (g), (h) and (i) a predetermined number of times; and (l) returning the design model to its state at the checkpoint of the optimization procedure that has resulted in the best net cost and benefit or to its state at the initial checkpoint in the event that no optimization procedure improved the design model so that the design is optimally changed to a new design.

A ninth aspect of the invention relates to a program storage device readable by a machine, tangibly embodying a program of instructions executable by the machine to perform method steps for analyzing and optimizing a design, a method for analyzing and optimizing a design, the method steps comprising the steps of:

(a) providing a model representing a design being optimized;

(b) providing a checkpoint manager for recording changes of the design between selected checkpoint reference points;

(c) providing an evaluator for determining the net cost and benefit of the changes between the selected reference points;

(d) establishing and retaining a checkpoint;

(e) applying an optimization procedure to cause at least one change in the design from the previously retained checkpoint to a final checkpoint;

(f) evaluating the at least one design change resulting from the optimization procedure to determine the net cost and benefit of the change;

(g) comparing the net cost and benefit of the optimization procedure just performed with the net cost and benefit of the previous optimization procedure performed associated with the previous retained checkpoint, and retaining the best net cost and benefit and final checkpoint of the optimization procedure just performed if there is an improved net cost and benefit;

(h) returning the design model to the immediately previous retained checkpoint;

(i) repeating steps (e) to (h) a predetermined number of times; and (j) returning the design model to its state at the checkpoint of the optimization procedure that has resulted in the last net cost and benefit retained or to its state at the initial checkpoint in the event that no optimization procedure improved the design model so that the design is optimally changed to a new design.

BRIEF DESCRIPTION OF THE DRAWINGS

The features of the invention believed to be novel and the elements characteristic of the invention are set forth with particularity in the appended claims. The Figures are for illustration purposes only. The invention itself, however, both as to organization and method of operation, may best be understood by reference to the detailed description which follows taken in conjunction with the accompanying drawings in which:

DETAILED DESCRIPTION OF THE INVENTION

Figure 8:
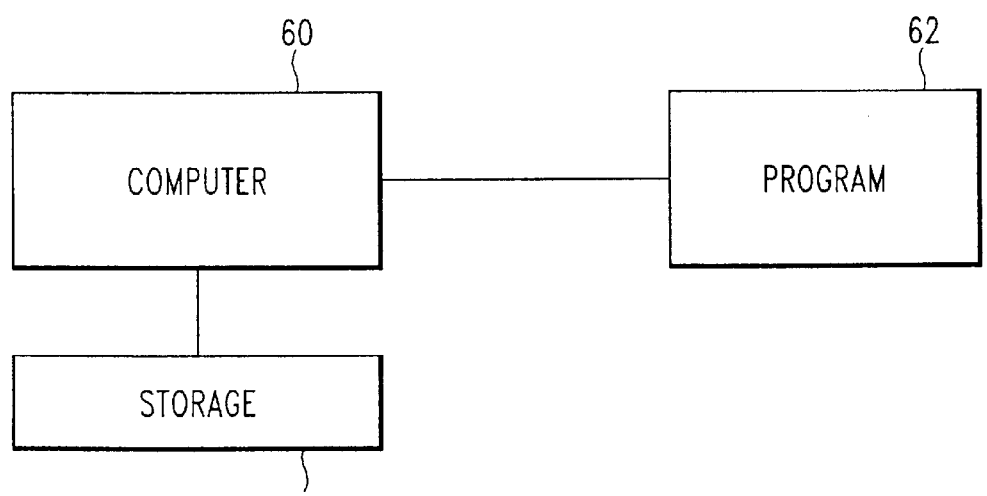
FIG. 8 is a block diagram illustrating an exemplary hardware environment of the present invention.

FIG. 8 is a block diagram that illustrates an exemplary hardware environment of the present invention. The present invention is typically implemented using a computer 60 comprised of microprocessor means, random access memory (RAM), read-only memory (ROM) and other components. The computer may be a personal computer, mainframe computer or other computing device. Resident in the computer 60, or peripheral to it, will be a storage device 64 of some type such as a hard disk drive, floppy disk drive, CD-ROM drive, tape drive or other storage device.

Generally speaking, the software implementation of the present invention, program 62 in FIG. 8, is tangibly embodied in a computer-readable medium such as one of the storage devices 64 mentioned above. The program 62 comprises instructions which, when read and executed by the microprocessor of the computer 60 causes the computer 60 to perform the steps necessary to execute the steps or elements of the present invention.

The method according to the present invention requires the following software components:

A design model (or data model) representing the design being optimized.

A checkpoint manager which records changes to the design between reference points called "checkpoints", and provides a means to return to any selected checkpoint.

One or more optimization or transformation procedures which change the design, each of which may be a series of simpler transformation procedures.

An evaluator which determines the net cost/benefit of a transformation.

The evaluator will in general include or use one or more incremental analyzers which give localized metrics of the "goodness" of a design. The "goodness" of a design is a measure of how well it meets the design objectives which can include whether or not it meets some absolute functional requirements and how well other flexible design objectives such as chip area, estimated yield, operating frequency, power consumption, etc. are optimized. Comparison of these metrics before and after a transformation allow the evaluator to generate a net cost/benefit for a transformation.

An optimization or transformation procedure is a software routine that modifies the design in some intended way. Some examples of optimization or transformation procedures include, but are not limited to:changing the transistor sizes or power level of a cell in the design; inserting a buffer; moving a cell; remapping a portion of the design to an alternative implementation; changing the width of a wire; changing the spacing between two wires; or changing the branch of the clock tree to which a latch pin is connected. The terms optimization procedure, transformation procedure and transformation may be used interchangeably throughout and have the same meaning.

Figure 1:
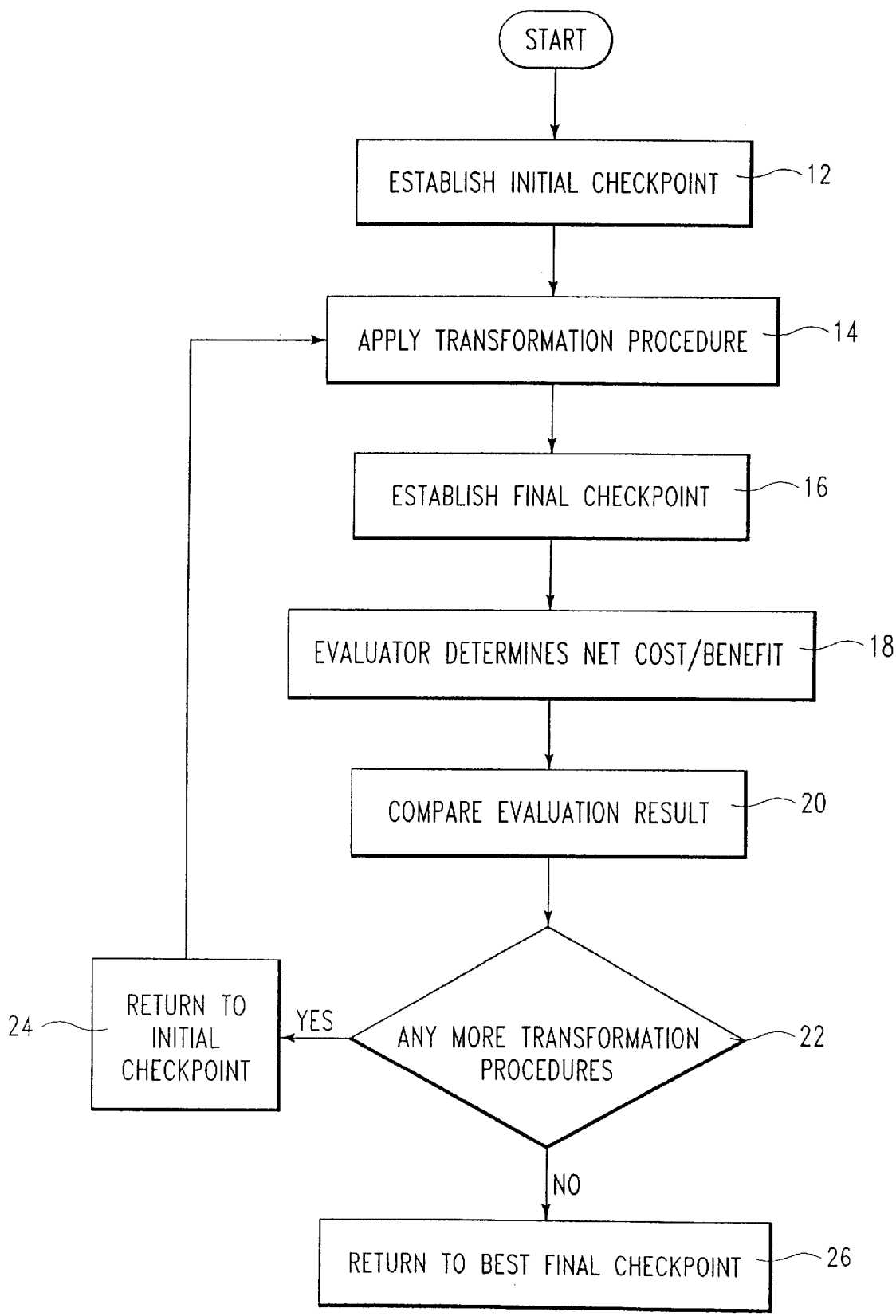
FIG. 1 is a flowchart of a first embodiment of the design tuning process according to the present invention.

Referring to the Figures in more detail, and particularly referring to FIG. 1, there is shown the general form of the method flow according to the present invention. The steps of the inventive method are as follows:

An initial checkpoint is established, block 12;

A transformation procedure is applied, block 14;

A final checkpoint is established, block 16;

The evaluator determines the net cost/benefit for the transformation, block 18;

The evaluation result is compared against previous evaluation results and the final checkpoint and evaluation result are retained if this is the best result so far, replacing the previous best, block 20;

If there are any more transformation procedures to be tried 22, the design model is returned to its state at the initial checkpoint and the previous steps are repeated; and The design model is returned to its state at the best final checkpoint 26.

The design model will be initialized to some value. For example, if timing of a semiconductor device was being optimized, the value under consideration may be the slack value, as defined above. The slack value may be arbitrarily set at zero. A transformation procedure is then applied to modify the design model in some way, for example, changing the wire size. Slack would then be determined again after the transformation procedure is applied to result in the final checkpoint value. The evaluator would then determine the net cost/benefit for the transformation procedure. Again, if slack were being measured, the evaluator would determine whether there is an effect on slack, i.e., the benefit, and the cost for the benefit, i.e., perhaps slack is improved but at a cost of increasing the chip area. Thus, the net cost/benefit is measured and evaluated according to some predetermined formula.

For comparison step 20, the "best evaluation result so far" will be initialized to indicate zero net cost or benefit, and initialize the best final checkpoint to be the initial checkpoint. In this case, only changes which improve the design will be accepted. Alternatively, the "best evaluation result so far" may be initialized to some minimum improvement threshold which any transformation is required to achieve. As another alternative, the "best evaluation result so far" may be initialized to a value which will be considered worse than any possible actual evaluation result, thus forcing one of the transformation alternatives to be accepted.

In comparison step 20, the "best evaluation result so far" may be compared against some "minimum required improvement" value. If the best result is at least as good as this value, the design model can proceed directly to returning the design model to its state at the best final checkpoint, step 26, and not try the remaining alternative transformation procedures.

Checkpoint Manager

A simplistic implementation of the checkpoint manager will save in the memory of the computer in which the checkpoint manager is embodied a copy of the entire model at each checkpoint. This is very inefficient for small changes to the design model and largely eliminates the savings we hope to achieve through incremental analysis and optimization.

Instead the checkpoint manager should monitor changes made to the design model and save enough information after each change to allow it to later reverse this change. The monitoring of design model changes can be done by recording the changes directly in the design model access routines or can be separated from the design model access routines via "callbacks". Callbacks allow one program to notify another program when something happens through a callback registration interface. Thus, these callbacks provide a means, i.e., the callback registration interface, for an application (such as the checkpoint manager) to register a routine, or several routines, they wish to have called whenever a design model change is made. Callbacks can also be used by incremental analyzers to determine which portions of the design they must reanalyze.

A further efficiency in the checkpoint manager can be achieved by recording only the first change to any piece of design model data between consecutive checkpoints. For example, if some data field has the value "1" at some initial checkpoint and is then set to "2" and subsequently to "3" and finally to "4", the original value of the field need only be recorded when the first change is made, since this is all that is needed to restore the original state. When the second change is made, the design model can recognize that the original state has already been recorded and need not record any information on the later changes. The design model need not record the final state because it is not needed to restore the original state, and even when used to synchronize design models in different computer processes (to be described below), the final value can still be found by looking in the model after the change.

The checkpoint manager may be asked to store state information for several different checkpoints simultaneously (e.g., the initial and final checkpoint which precede and follow the application of a particular optimization, as will be described later). The checkpoint manager will preferentially organize these checkpoints in a tree structure in which the children of a given checkpoint are the checkpoints for design model states which result from transformations of the design model from the state at the parent checkpoint. The checkpoint manager has two pointers into the tree of checkpoints, one to the root of the tree, and one to the current checkpoint. As changes are made to the design model and are recorded by the checkpoint manager, they are associated with the most recently established or visited checkpoint. Each checkpoint has an associated LIFO stack which contains the information necessary to recreate the state associated with the checkpoint. This information usually specifies how to modify the design model from the state represented by the parent checkpoint to the state represented by the children's checkpoint.

When the checkpoint manager is asked to return the design model to the state at some particular checkpoint, it first finds the chain of checkpoints leading from the current state to the desired state. Because the checkpoints are connected in a tree structure, there is exactly one such chain. The changes recorded with each checkpoint along the chain are then undone in the reverse order from that in which they were originally made. These reverse changes are then stored with the most recently visited checkpoint (the previous checkpoint in the chain that is being followed) so that it may later be returned to if requested to do so.

Evaluation Flow

The evaluation step 18 performed is generally done using one or more so-called incremental analyzers.

Generally, an incremental analyzer is one which can analyze the effects of some design change without redoing the analysis of the entire design. This is generally accomplished by first doing some initial analysis and retaining information from that analysis. When changes to the design are made, the analyzer then uses information about the change combined with retained information from the earlier analysis to determine the effect of the change on the analysis results.

Incremental analyzers are related to, but separate from, lazy evaluation which defers the computation of analysis information until it is needed. Lazy evaluation defers "when" any necessary analysis is done, and incremental processing reduces the "amount" of reprocessing needed when things change. They can be combined.

Then, such incremental analyzers monitor changes to the design model so that they need visit only the portions of the design which have changed in order to update their analysis results. This is usually done by registering callback routines which are called when changes are made to the design model, but may instead occur by having the analyzers tightly coupled to the design model such that the analysis results update is intertwined with the design model update. Given such analyzers, the evaluation result in step 20 can be done in different ways depending on the nature of the analyzers employed. Two types of incremental analyzers are what the present inventors call Analyzer Type I (AT-1) and Analyzer Type II (AT-2) and are explained in more detail below.

AT-1 Incremental Analyzers

An incremental analyzer may return local values which represent local characteristics of the design. An example would be the Abato et al. timing analyzer, discussed above, which produces slack values at any circuit pin in the design.

Since the incremental analyzers only look at the portions of the design that have changed, the evaluation time of the incremental analyzer is proportional to the size of the change. To keep the evaluation time proportional to the size of the change, the evaluator needs to know where the change(s) occurred so that it can avoid traversing the entire design model looking for changes and can still ensure that the evaluation result reflects all relevant changes in the analysis domain.

Such an analyzer will preferentially operate using lazy evaluation, meaning that the local value for any point is not computed or updated until and unless it is required. It will provide an interface through which the evaluator may query the location(s) of changes affecting the results of that analyzer.

AT-2 Incremental Analyzers

An incremental analyzer can return a single value which summarizes the metric for the entire design. An example would be an analyzer which returns the total chip area occupied by a design, one which returns the total power consumed by a design, or one which computes a total skew cost for a clock tree such as that disclosed in Hathaway, discussed above. In this case the evaluator merely asks for this value, and the analyzer algorithm itself must control the incremental analysis cost.

Timing analysis generally produces separate slack values at many internal points in a design, thus the AT-1 analyzer is best suited for timing analysis. Alternatively, all these slack values could be encapsulated in a single worst slack number across the entire design, making it suitable for AT-2 analysis, but such a scenario would not be particularly useful since it does not change except for changes which directly affect the worst slack path, and hence gives no way to evaluate many potential design changes. As another alternative, the AT-2 analysis could be used to return the average slack. But since chip performance is reflected by the worst slack path, such an analysis would also not be useful.

In contrast, a total chip power consumption analyzer generally gives a single number representing total chip power consumption and thus is suitable for AT-2 analysis. Since any local power consumption change will be reflected in the chip total, this is a useful result.

An incremental analyzer also may or may not explicitly interact with a checkpoint manager. If it does so, the incremental analyzer can register changes in its own data structures with the checkpoint manager in the same manner that design model changes are registered, allowing them to be undone whenever the checkpoint manager is asked to take the design model to a particular checkpoint. Otherwise the analyzer can monitor changes to the design model caused when the checkpoint manager moves the design model to checkpoint in the same manner as other design changes, without specifically recognizing that the set of changes to return to a checkpoint are the reverse of the changes made since that checkpoint. The choice of whether or not to interact in this way can be made based on the relative processing and/or memory cost of restoring and recomputing the previous state.

Figure 2:
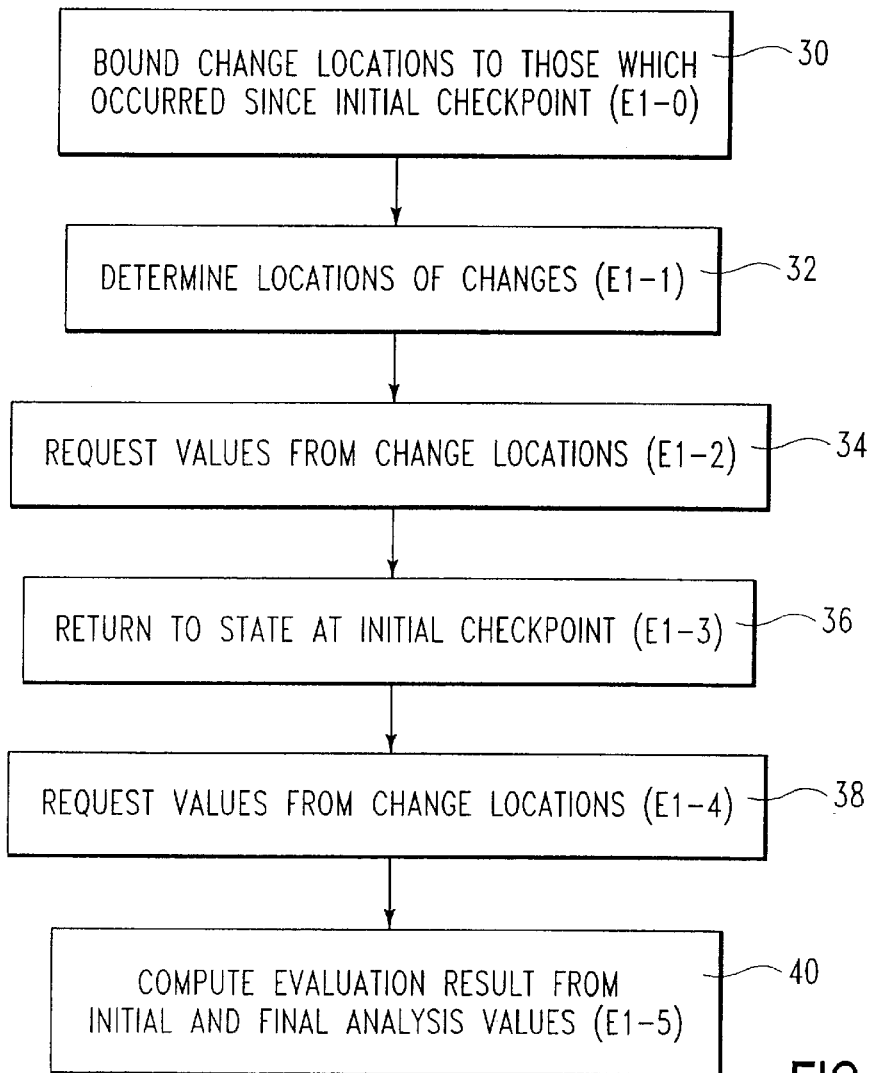
FIG. 2 is a flowchart of a first embodiment of AT-1 evaluation (defined hereafter) according to the present invention.

Referring now to FIG. 2 in addition to FIG. 1, the detailed flow for the evaluator step 18 above that is required to support analyzers of type AT-1 is as follows:

E1-0) During the steps of the establishment of the initial checkpoint, block 12 (FIG. 1), and returning the design model to the initial checkpoint, block 24 (FIG. 1), the analyzers must be notified to bound the set of change locations reported later to those which occurred since the initial checkpoint, as indicated by step 30;

E1-1) All analyzers are queried to determine the locations of changes to each analysis domain since the initial checkpoint, as indicated by step 32;

E1-2) Values at these change locations are requested from the analyzers, as indicated by step 34. These will be the analysis answers at the final checkpoint;

E1-3) The design model is returned to its state at the initial checkpoint, as indicated by step 36;

E1-4) Values at these change locations are again requested from the analyzers, as indicated by step 38. These will be the analysis answers at the initial checkpoint; and E1-5) The evaluation result is computed by comparing the initial and final analysis values, as indicated by step 40.

Note that the evaluation process changes the state of the design model, by leaving it in the initial state rather than the final state. This is not a problem because the design model will be returned to a specific state in either step of returning the design model to the initial checkpoint 24 or to the best final checkpoint 26 before it is used again. If there are additional transformations to evaluate, the "return to initial checkpoint" operation 24 will require no action since the design model will already be at the initial checkpoint.

The reason for this ordering (computing the final evaluation answers and then the initial answers) is that the changed locations for the analyzers are not known until the transformation has been applied. So to restrict the analysis queries to these locations, any analysis queries cannot be made until then. Since the design model is at the final state after the transformation application, it is most efficient to first compute analysis results there. The design model is then returned to the initial checkpoint to evaluate initial analysis results there, incidentally setting the model up for the next transformation evaluation.

Note that a transformation may add or delete locations within the design model, and added locations may be among those returned by the analyzer in step E1-1, 32. Such locations will be deleted when the design model is returned to the initial checkpoint in step E1-3, 36 so the design model must recognize them and omit them from the list of change locations for which initial values are requested in step E1-4, 38.

For some analyzers, it may be desirable to report only a subset of the locations which have changed if the changed locations can reflect the impact of the transformation on the entire design model. For example, all changes which affect a static timing analysis may be represented as changes to delay edges in the delay graph associated with the design model (addition, deletion, or change in delay value). The effects of such changes can propagate forward and backward, influencing arrival times (ATs) in the forward cone of the change and required arrival times (RATs) in the backward cone of the change. But any change in the worst slack (RAT−AT) will be seen at the endpoints of one of the changed delay segments. So an evaluator interested only in the worst slack only needs to know about change locations at these changed delay segment endpoints, and not about the propagated AT and RAT changes. See Abato et al.(above) for more details.

Note that the evaluation process of steps E1-0 through E1-5 will work for either type of analyzer, and hence is most general.

Figure 3:
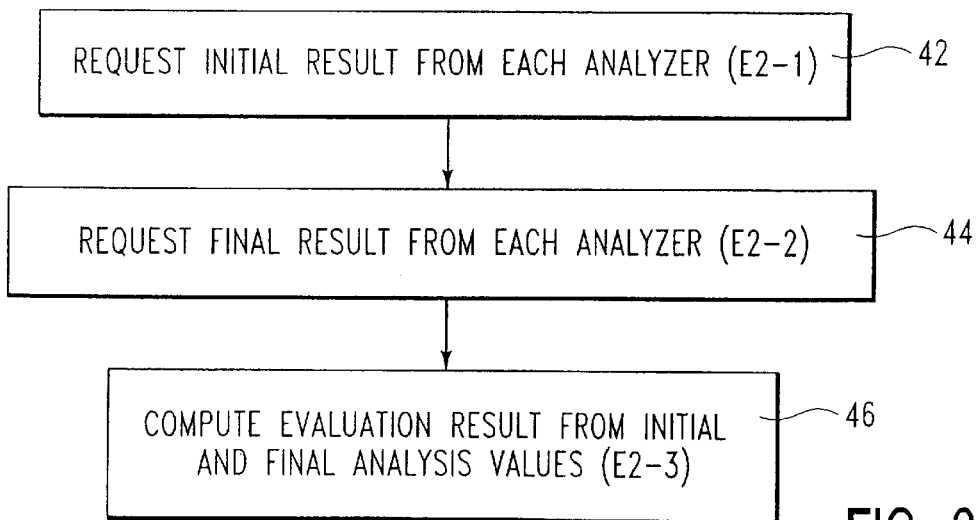
FIG. 3 is a flowchart of an embodiment of AT-2 evaluation (defined hereafter) according to the present invention.

However, if all analyzers being used by the evaluator are of type AT-2, a different evaluation process can be used as shown in FIG. 3 and described as follows:

E2-1) During the step of establishing an initial checkpoint 12 (FIG. 1), the initial results from each of the analyzers are requested and set aside; and E2-2) In the step of determining the net cost/benefit of a transformation 18, the final results from each of the analyzers are requested and the evaluation result is computed by comparing the initial and final analysis values.

Evaluation results will combine the information from different analyzers in different ways. The following are examples of these, but are not a complete list.

The evaluation result may be a single number which is some function (e.g., a linear combination) of the various analysis results, such that the larger or smaller evaluation result is considered better.

The evaluation result may be an ordered list of values from the various analyzers, such that the result with the larger or smaller first value is considered better, and if those values are equal the result with the larger or smaller second value is considered better, etc.

Individual analysis results from analyzers of type AT-2 may themselves be combined in different ways to contribute to the evaluation result. The evaluator may sum them, take the maximum or minimum, take the mean or median, or pass them as a set of values to be compared individually. In the latter case the comparison of evaluation results might take the difference between corresponding initial and final values and then combine these differences (sum, mean, etc.) to determine the evaluation result or some portion of it.

Transformations in electronic chip design may include, but are not limited to: changing the transistor sizes or power level of a cell in the design; inserting a buffer; moving a cell; remapping a portion of the design to an alternative implementation; changing the width of a wire; changing the spacing between two wires; or changing the branch of the clock tree to which a latch pin is connected.

Analyzers which would apply in this application may include timing analyzers which determine whether the design meets performance requirement, such as that disclosed in Abato et al. (above), noise analyzers which determine whether signals in the design are adversely affected by interference, power analyzers which determine the power consumed by the design, clock skew analyzers which determine the skew of the clock distribution network in the design, such as that disclosed in Hathaway (above), congestion analyzers which (before wire routing) predict whether all required nets will be able to be routed, area analyzers which (before placement) predict the area which will be occupied by the design or portions thereof, and yield analyzers which predict the manufacturing yield of the design (e.g., through critical area analysis).

The purposes and advantages of the present invention will become more apparent after reference to the following Example.

Electronic Chip Design Example

For the Example, the application of electronic chip design will be chosen. Assume the Example takes place in a logic synthesis environment and the design has been mapped to 2-way NAND technology cells which are available in three different power levels N1, N2, and N3. The technology also includes buffers, also with three different power levels B1, B2, and B3.

Power levels indicate the drive strength of a cell. Different power levels of a cell generally have different sized transistors, and may have different internal structures (i.e., a high power level with higher drive strength will often include an internal output buffer stage which is omitted from lower power levels). Generally, higher power levels are faster, especially when driving large loads, but at very light loading conditions a lower power level may actually be faster. As the name implies, different power levels also use different amounts of power (generally meaning they draw more current at the same supply voltage), though in general this also depends somewhat on loading conditions.

The evaluation criteria will be the worst slack of the circuit as determined by a timing analyzer such as that disclosed in Abato et al.(above), and the area occupied by the circuit. The area occupied by the circuit will also be referred to hereafter as "size". All cells in the design are initially assumed to be set to the middle power level.

The transformations will be:

PU) To increase the power level of a critical path cell by one unit, e.g., from N1 to N2;

IB1) To insert a B1 buffer at the source of a critical path net;

IB2) To insert a B2 buffer at the source of a critical path net; and

IB3) To insert a B3 buffer at the source of a critical path net.

Transformations IB1, IB2, and IB3 will not be applied to primary input nets of the circuit.

The present inventive method will be used to select among the application of all of these transformations to each cell and net in the worst slack path in the design. Cell should be understood to mean a particular choice of gate function from the library used for the design while the circuit should be understood to mean the entire design.

The sizes and delays of the NANDs and buffers are as follows. In a more realistic example we would include net delays, a dependency of delay on input slew, and different delays for different block inputs.

| Cell/ | | Delay | | |
| power level | Size | FO = 1 | FO = 2 | FO = 3 |
| --- | --- | --- | --- | --- |
| N1 | 4 | 3.0 | 5.0 | 7.0 |
| N2 | 6 | 3.5 | 4.5 | 5.5 |
| N3 | 8 | 4.0 | 4.5 | 5.0 |
| B1 | 1 | 0.5 | 3.0 | 5.5 |
| B2 | 4 | 1.0 | 1.8 | 2.6 |
| B3 | 8 | 1.2 | 1.5 | 1.8 |

FO=fanout

Figure 4:
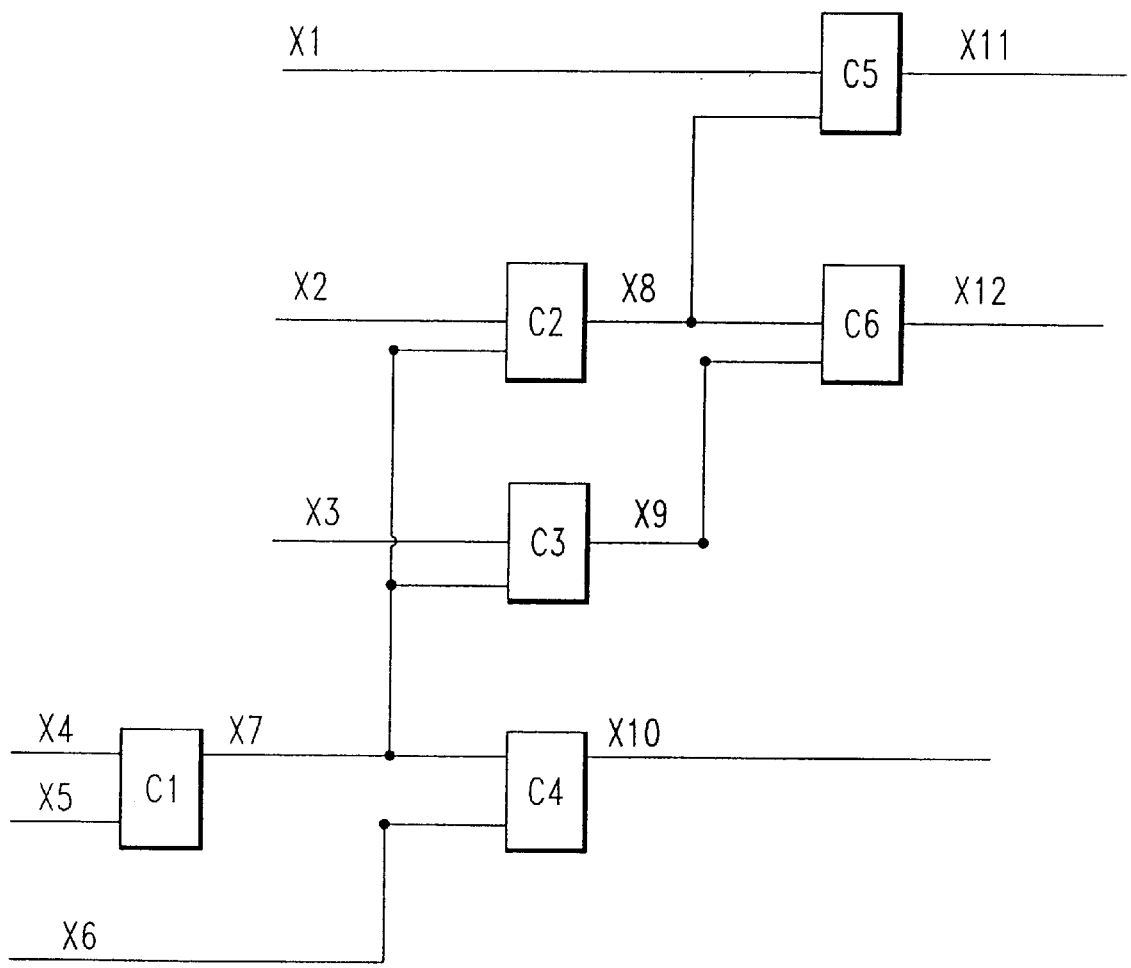
FIG. 4 is a schematical block diagram of a circuit used to demonstrate the design tuning process of the present invention.

The circuit under consideration is that shown in FIG. 4. All cells are N2 power level. Reference will also be made to the process flow in FIG. 1 and the evaluation flow in FIG. 2.

The initial circuit size (i.e., the area occupied by the circuit) and the ATs and RATs on all nets are then:

Size=36

| Net | AT | RAT | Slack |
| --- | --- | --- | --- |
| X1 | 0.0 | 5.5 | 5.5 |
| X2 | 0.0 | 1.0 | 1.0 |
| X3 | 0.0 | 2.0 | 2.0 |
| X4 | 0.0 | −4.5 | −4.5 |
| X5 | 0.0 | −4.5 | −4.5 |
| X6 | 0.0 | 5.5 | 5.5 |

-continued

| Net | AT | RAT | Slack |
|-----|-----|-----|-------|
| X7  | 5.5 | 1.0 | −4.5  |
| X8  | 10.0| 5.5 | −4.5  |
| X9  | 9.0 | 5.5 | −3.5  |
| X10 | 9.0 | 9.0 | 0.0   |
| X11 | 13.5| 9.0 | −4.5  |
| X12 | 13.5| 9.0 | −4.5  |

The specification of units for the size and times are irrelevant to the examples as the examples are comparing relative performance for different optimizations. For size, the units could be, for example, square microns. For time, the units could be, for example, picoseconds, nanoseconds or even seconds.

Arrival times (ATs) at all inputs (nets X1–X6) are 0.0 and the required arrival times (RATs) at all outputs (nets X10–X12) are 9.0. The timing analysis is being done in late mode. The AT at other points is the maximum over all driving gate inputs of the gate input arrival time plus the gate delay. For example, the initial AT for X8 is:

max ((AT(X2)+D(C2)), (AT(X7)+D(C2)))=max ((0.0+4.5), (5.5+4.5))=max (4.5, 10.0)=10.0

The delay of gate C2 is determined from the delay table (above). Gate C2 is an N2 cell/power level and has a fanout of 2 so, according to the delay table, the delay of gate C2 is 4.5.

The RAT at other points is the minimum over all driven gates of the RAT at the gate output minus the gate delay. For example, the initial RAT for X8 is:

min ((RAT(X11)−D(5)), (RAT(X12)−D(C6)))=min ((9.0−3.5), (9.0−3.5))=min (5.5, 5.5)=5.5

The slack is RAT−AT, so the initial slack for X8, for example, is RAT(X8) −AT(X8)=5.5−10.0=−4.5.

The negative RAT values arises from the fact that in static timing analysis, cyclic design behavior is actually folded into one time frame. That is, while the real circuit takes multiple cycles to propagate data through a path containing several latches, the static timing analyzer considers all cycles at once. A negative. RAT means that even if the signal arrived at some point X at the beginning of the cycle, it would still be too late, because the delay of the path from X to some capture point (e.g., a latch) is greater than the cycle time.

The worst slack of −4.5 is on the paths through nets (X4 or X5) through cell C1 through net X7 through cell C2 through net X8 through cells (C5 or C6) and, finally, through nets (X11 or X12).

Thus the list of transformations to be tried will be as indicated in the list below where the nomenclature "A–B" indicates application of transformation A to object B. In other words,"PU-C1" means increasing the power level of cell C1 where "increasing the power level" is the transformation. If C1 was at power level N2, the transformation will increase the power level of cell C1 to N3. Similarly, "IB1-X7" means inserting a B1 buffer at the source of net X7, so X7 now feeds only the new buffer and the old sinks of X7 are now fed by the buffer output.

PU-C1
PU-C2
PU-C5
PU-C6
IB1-X7
IB2-X7
IB3-X7
IB1-X8
IB2-X8
IB3-X8
IB1-X11
IB2-X11
IB3-X11
IB1-X12
IB2-X12
IB3-X12

The first analyzer (of type AT-1) will be a timing analyzer of the sort described in Abato et al. (above), with an added ability to report the location of changes (the sources and sinks of delay segments which have been added, deleted, or have had their delay value changed).

The second analyzer will be of type AT-2 and will keep track of the total area occupied by the circuit. When design model changes are made it will subtract from its running total of circuit area the size of any deleted cells, add the size of any added cells, and add the difference between the new and old sizes of any repowered cells.

Transformations are preferred which offer the greatest improvement in the worst slack, and among those which give an equal improvement, the one which offers the best area decrease. Thus, such transformations offer the greatest net cost/benefit in this Example. Transformations which increase the magnitude of the worst (negative) slack or which leave the worst slack the same and increase the area will not be accepted. Thus, the evaluation result will be a pair: (change in worst slack, change in area).

The inventive process is started by establishing an initial checkpoint CP-0 according to step 12 which starts the checkpoint manager recording changes to the design. At this time, the timing analyzer is notified that the change locations to be requested later will be with respect to this point, according to step E1-0, 30.

The first transformation PU-C1 is next applied according to step 14 which changes the circuit timing and size to:
Size=38

| Net | AT | RAT | Slack |
|-----|------|------|-------|
| X1  | 0.0  | 5.5  | 5.5   |
| X2  | 0.0  | 1.0  | 1.0   |
| X3  | 0.0  | 2.0  | 2.0   |
| X4  | 0.0  | −4.0 | −4.0  |
| X5  | 0.0  | −4.0 | −4.0  |
| X6  | 0.0  | 5.5  | 5.5   |
| X7  | 5.0  | 1.0  | −4.0  |
| X8  | 9.5  | 5.5  | −4.0  |
| X9  | 8.5  | 5.5  | −3.0  |
| X10 | 8.5  | 9.0  | 0.5   |
| X11 | 13.0 | 9.0  | −4.0  |
| X12 | 13.0 | 9.0  | −4.0  |

A final checkpoint CP-PU-C1 is then established according to step 16.

The evaluator is then called according to step 18 to determine net cost/benefit for the transformation from CP-0 to CP-PU-C1.

According to step E1-1, 32, the evaluator then queries the timing analyzer to determine the change locations, which in this case are the inputs and outputs of the cell (C1) whose delay has changed: nets X4, X5, and X7.

According to step E1-2, 34, the evaluator then requests slack values at these points, getting the values slack(X4)=−4.0, slack(X5)=−4.0, and slack(X6)=−4.0 as shown in the table above. It also requests the final size, which is 38.

According to step E1-3, 36, the design model is next returned to its state at the initial checkpoint, CP-0, step 24.

According to step E1-4, 38, the initial slack values at X4, X5, and X6 are then requested. The incremental timing analyzer recognizes the changes which have occurred and returns the original slack values of slack(X4)=−4.5, slack(X5)=−4.5, and slack(X6)=−4.5 as shown in the table above. It also requests the initial size, which is 36.

The change in the worst slack from CP-0 to CP-PU-C1 is 0.5 and the area difference is 2, so according to step E1-5, 40, the evaluation result is determined as (0.5, 2).

Returning from the evaluator, according to step 20, since no previous best result has been recorded, the evaluation result is compared against the initial checkpoint, i.e., the zero cost/benefit evaluation result of (0, 0). Since the current result is better (slack has improved), CP-PU-C1 is recorded as the best final checkpoint so far with associated evaluation result (0.5, 2).

Since there are more transformations to try, according to step 22, the design model will be returned to the initial checkpoint CP-0 (a null operation since the design model is already there) and notify the timing analyzer that the change locations to be requested later will be with respect to this point, according to step E1-0, 30.

The design model is then returned to step 14 to apply transformation procedure PU-C2 which changes the circuit timing and size to:
Size=38

| Net | AT | RAT | Slack |
|---|---|---|---|
| X1 | 0.0 | 5.5 | 5.5 |
| X2 | 0.0 | 1.0 | 1.0 |
| X3 | 0.0 | 2.0 | 2.0 |
| X4 | 0.0 | −4.5 | −4.5 |
| X5 | 0.0 | −4.5 | −4.5 |
| X6 | 0.0 | 5.5 | 5.5 |
| X7 | 5.5 | 1.0 | −4.5 |
| X8 | 10.0 | 5.5 | −4.5 |
| X9 | 9.0 | 5.5 | −3.5 |
| X10 | 9.0 | 9.0 | 0.0 |
| X11 | 13.5 | 9.0 | −4.5 |
| X12 | 13.5 | 9.0 | −4.5 |

A final checkpoint CP-PU-C2 is established according to step 16.

The evaluator is called according to step 18 to determine net cost/benefit for the transformation procedure from CP-0 to CP-PU-C2.

According to step E1-1, 32, the evaluator then queries the timing analyzer to determine the change locations, which in this case are the inputs and outputs of the cell (C1) whose delay has changed: nets X2, X7, and X8.

According to step E1-2, 34, the evaluator then requests slack values at these points, getting the values slack(X2)=1.0, slack(X7)=−4.5, and slack(X8)=−4.5 as shown in the table above. It also requests the final size, which is 38.

According to step E1-3, 36, the design model is next returned to its state at the initial checkpoint, CP-0.

According to step E1-4, 38, the initial slack values at X2, X7, and X8 are then requested. The incremental timing analyzer recognizes the changes which have occurred and returns the original slack values of slack(X2)=1.0, slack(X7)=−4.5, and slack(X8)=−4.5 as shown in the table above. It also requests the initial size, which is 36.

The change in the worst slack from CP-0 to CP-PU-C2 is 0.0 and the area difference is 2, so according to step E1-5, 40 the evaluation result is determined as (0.0, 2).

Returning from the evaluator, according to step 20 the new evaluation result (0.0, 2) is compared against the previous best of (0.5, 2), and since the previous value was better we discard them, retaining the previous best.

Since there are more transformations to try, according to step 22, the design model will be returned to the initial checkpoint CP-0 (a null operation since the design model is already there) and notify the timing analyzer that the change locations to be requested later will be with respect to this point, according to step E1-0, 30.

Steps 14 through 24 are performed for remaining transformation procedures IB1-X7 IB2-X7, IB3-X7, IB1-X8, IB2-X8, IB3-X8, IB1-X11 IB2-X11, IB3-X11, IB1-X12, IB2-X12, and IB3-X12, giving evaluation results:

| Transformation | Result | Retained as best so far? |
|---|---|---|
| IB1-X7 | (−3.5, 1) | No |
| IB2-X7 | (−0.6, 4) | No |
| IB3-X7 | (0.2, 8) | No |
| IB1-X8 | (−2.0, 1) | No |
| IB2-X8 | (−0.8, 4) | No |
| IB3-X8 | (−0.5, 8) | No |
| IB1-X11 | (−0.5, 1) | No |
| IB2-X11 | (−1.0, 4) | No |
| IB3-X11 | (−1.2, 8) | No |
| IB1-X12 | (−0.5, 1) | No |
| IB2-X12 | (−1.0, 4) | No |
| IB3-X12 | (−1.2, 8) | No |

Since the best final checkpoint is still CP-PU-C1, according to step 26 the final change is made to return the design model to its state at this checkpoint.

Iterative Application of Transformation Procedures

In some circumstances it may be appropriate to repeatedly apply the same transformation procedure multiple times. For example, there may be a transformation procedure which moves a cell in an electronic circuit design a certain distance toward the mean location of the cells driving it or toward the mean location of the cells it drives. In such a case, the cell may be repeatedly moved to determine the best location for it. As another example, there may be a transformation procedure like the PU transformation above which is applied to a cell with several available higher power levels. In this case, the transformation procedure may be applied repeatedly to determine the best power level for the cell.

One could choose to simply apply the transformation procedure once, go back to the initial checkpoint, apply it twice, go back, etc. But the process can be more efficient.

Figure 5:
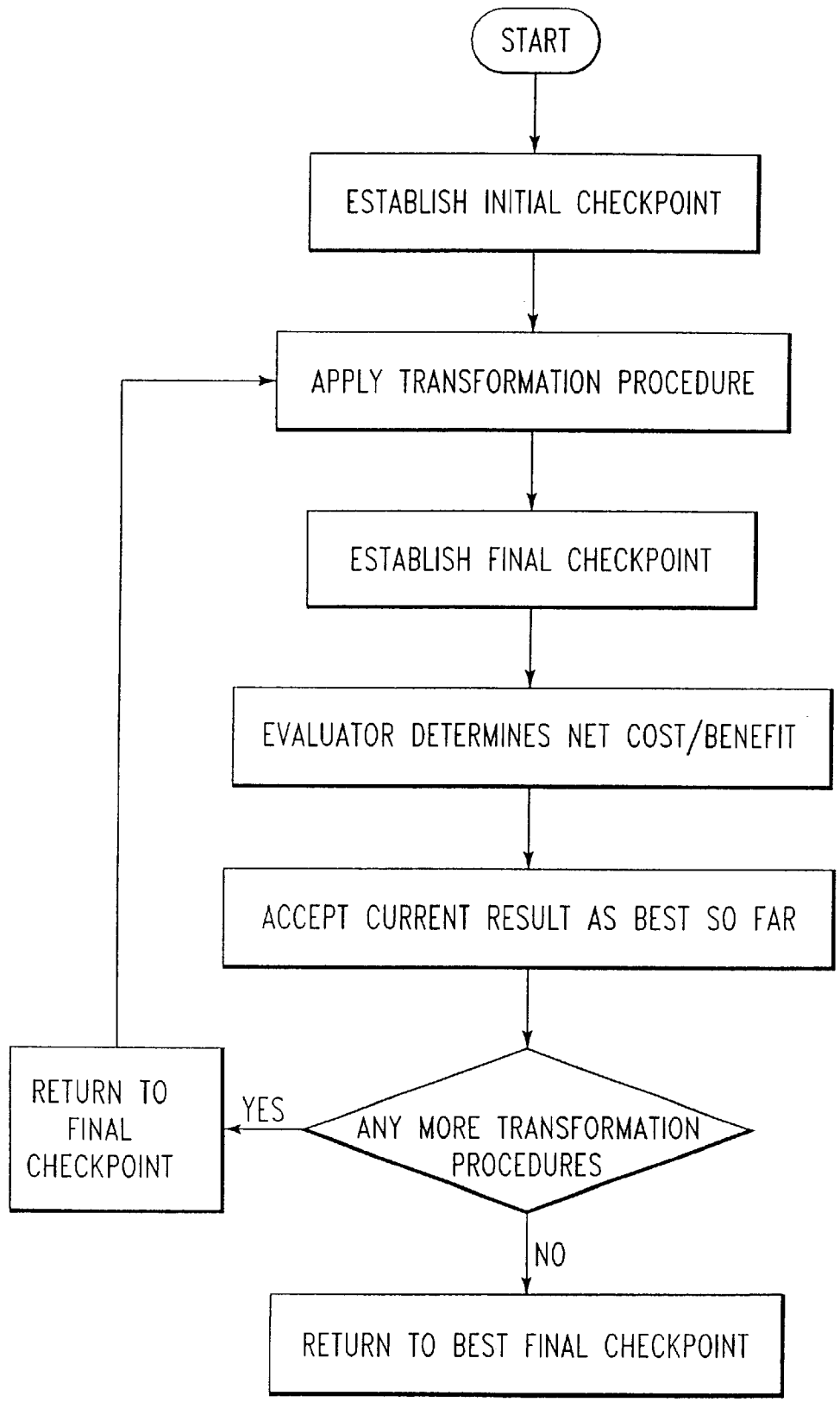
FIG. 5 is a flowchart of a second embodiment of the design tuning process according to the present invention.
Figure 6:
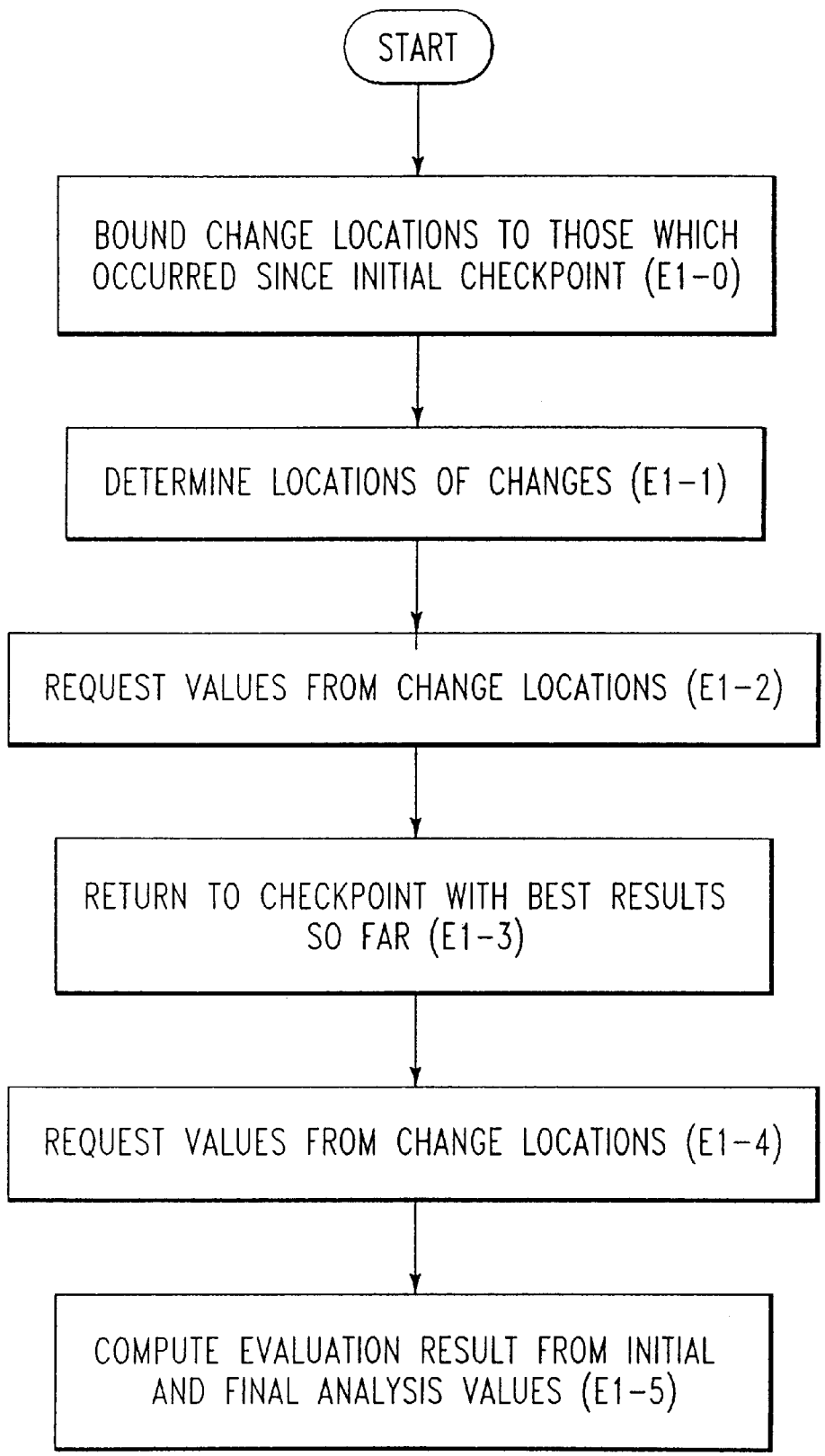
FIG. 6 is a flowchart of a second embodiment of AT-2 evaluation according to the present invention.

In terms of the steps described above with respect to FIGS. 1 and 2, an iterative application would change step 24 to return to the final checkpoint for the next application of the transformation, and would change step E1-3, 36 to return to the checkpoint associated with the best result so far, only returning to the initial checkpoint if no beneficial result has been found so far. Step 20 would also be changed so that the current checkpoint would be accepted as the best so far if it gives any positive benefit, rather than comparing it against the previous best evaluation result. The modified process flow for the iterative application of the present invention is shown in FIGS. 5 and 6 and graphically illustrated in FIG. 7.

Figure 7:
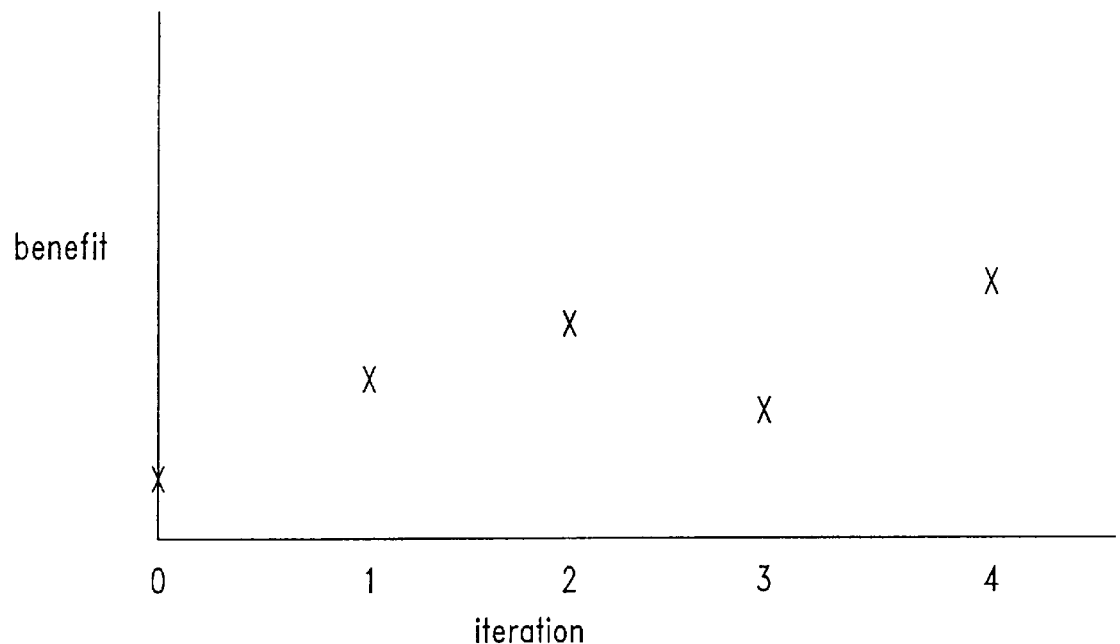
FIG. 7 is a graph illustrating the results of the design tuning process according to the second embodiment of the invention.

Iteration 0 in FIG. 7 is the initial state. Iterations 1 and 0 are compared and iteration 1 is kept because the change is beneficial. Iterations 1 and 2 are compared and iteration 2 is kept because it is beneficial even though the benefit is less than that from iteration 0 to iteration 1. Iterations 2 and 3 are compared but iteration 3 is not kept because the change is not beneficial compared to iteration 2. Lastly, iterations 2 and 4 are compared and iteration 4 is kept because the change is beneficial.

Further efficiency can be achieved if the evaluation results are additive, i.e., the evaluation result for the change from A to C equals the sum of the evaluation results for the changes from A to B and from B to C.

In this case, one can always compare against the most recent checkpoint rather than against the initial checkpoint or the best checkpoint so far. A running "total" evaluation result (initially zero) is kept adding the result of each successive comparison and retaining the best result and associated checkpoint.

In terms of the steps described above, an iterative application with additive evaluation results would change step 24 (FIG. 1) to return to the final checkpoint for the next application of the transformation, would change step E1-3, 36 (FIG. 2) to return to the checkpoint associated with the previous iteration, and would change step 20 (FIG. 1) to add the current evaluation result to the running total and to accept the current checkpoint as the best so far if the running total evaluation result is the best so far.

Other variations are possible in which different pairs of checkpoints are compared.

Recursive Application of Transformation Procedures

One of the transformation procedures executed in the inventive process can itself be another instance of the inventive method. If the same evaluator is used for both nested decision processes, the evaluation process need not be repeated. Rather, the nested decision process can omit step 26 (FIG. 1) and instead return its best result and checkpoint to the outer decision process and have the outer decision process omit step 18 (FIG. 1), using the returned value instead.

Alternatively, the nested process can return a list of transformations to be applied to the outer decision process, effectively flattening the nested decision process.

Parallel Exploration of Alternative Transformation Procedures

Finally, the exploration of alternative transformations may be distributed to different computers or computer processes to be performed in parallel.

In this case steps 14 through 18 (FIG. 1) are performed on different computers, after the same model has been read into each computer and communication means have been established by which the processes can coordinate their actions. When the processes have finished they send their results to a master process which compares those results to determine which was best. In a preferred embodiment, the various processes continue running so that they can be used for subsequent decision processes and therefor must all bring their local design models to the best final state. The master process therefore instructs the checkpoint manager in the process having the best result to send the checkpoint associated with its best final result to all other processes, the other processes keeping this checkpoint as their best final checkpoint. All processes then proceed to step 26 (FIG. 1) and bring their models to the same final state.

In the preferred embodiment the checkpoint manager will store its information internally in terms of pointers indices, or other efficient references to objects in its design model. Such values will in general be different in different processes, so the checkpoint managers must be able to translate the changes stored with each checkpoint into process-independent terms, such as name strings for the nets, cells, and ports in the design model.

Other Applications of the Present Invention

The present invention is particularly suitable for electronic chip design and most of the discussion herein has been directed at this particular application. However, it should be understood that the present invention is also suitable for other applications such as mechanical design and publishing.

Mechanical Design

Transformations in mechanical design may include such things as changing the material used for components, the physical positioning of components in the system to change the balance, moment arm, or other characteristics, to change the size of components to change the weight and stress concentrations, changing gear ratios, etc.

Analyzers which would apply in this application may include stress analyzers to determine the stress on various system components, efficiency analysis to determine power transfer efficiencies, weight analysis to optimize system weight, vibrational analysis to determine the stability of the system with respect to vibrations, etc.

Page Layout (Publishing)

Transformations in page layout may include such things as splitting text into multiple columns or to be continued on another page, moving a column or picture, changing a column width, changing the point size for a headline font.

Analyzers which would apply in this application may include minimizing the number of continued columns, maximizing the weighted importance of the articles appearing on the front page, rewarding the proximity of pictures to their associated articles, penalizing overly shortened columns, etc.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for analyzing and optimizing a design, the method comprising the steps of:

(a) providing a model representing a design being optimized;

(b) providing a checkpoint manager for recording and reversing changes of the design between selected reference points, the selected reference points being an initial checkpoint and a final checkpoint;

(c) providing an evaluator for determining the net cost and benefit of the changes between the selected reference points;

(d) applying a first optimization procedure to cause at least one change in the design; and (e) evaluating the at least one design change to determine the net cost and benefit of the design change between the design at the initial checkpoint and the design at the final checkpoint, wherein if the at least one design change results in improved net cost and benefit, then the design is optimized.

2. The method of claim 1 further comprising the steps of:
(f) establishing a first initial checkpoint; and
(g) establishing a first final checkpoint after applying the first optimization procedure, the step of evaluating determining the net cost and benefit between the first initial and first final checkpoints.

3. The method of claim 2 wherein the step of evaluating comprises the following steps in the specified order:
(e1) evaluating at least one design parameter of the at least one design change at the first final checkpoint to obtain a first evaluation result;
(e2) returning the design model to the first initial checkpoint;
(e3) evaluating the at least one design parameter at the first initial checkpoint to obtain a second evaluation result; and
(e4) comparing the first and second evaluation results to determine the net cost and benefit of the at least one design change.

4. The method of claim 2 further comprising the steps of:
(h) establishing a second initial checkpoint;
(i) applying a second optimization procedure to cause at least one change in the design; and
j) establishing a second final checkpoint after applying the second optimization procedure, the step of evaluating determining the net cost and benefit between the second initial and second final checkpoints.

5. The method of claim 4 wherein the step of evaluating comprises the following steps in the specified order:
(e1) evaluating at least one design parameter of the at least one design change at the second final checkpoint to obtain a first evaluation result;
(e2) returning the design model to the second initial checkpoint;
(e3) evaluating the at least one design parameter at the second initial checkpoint to obtain a second evaluation result; and
(e4) comparing the first and second evaluation results to determine the net cost and benefit of the at least one design change.

6. The method of claim 4 wherein the first and second optimization procedures are each executed on a different computer.

7. The method of claim 4 further comprising the step of:
(k) comparing the net cost and benefits of the first and second optimization procedures and retaining the final checkpoint and change in the design from the optimization procedure that gives the best net cost and benefit.

8. The method of claim 7 further comprising the step of:
(l) recursively repeating steps (d) to (k).

9. The method of claim 4 wherein the first initial checkpoint and second initial checkpoints are the same and further comprising the steps of:
(k) providing means to return to any of the selected reference points;
(l) comparing the net cost and benefits of the first and second optimization procedures and retaining the change in the design from the optimization procedure that gives the best net cost and benefit;
(m) and returning to the first and second initial checkpoints.

10. The method of claim 9 further comprising the steps of:
(n) applying at least one additional optimization procedure to cause at least one change in the design from the first and second initial checkpoints;
(o) establishing at least a third final checkpoint after applying the at least one additional optimization procedure, the step of evaluating determining the net cost and benefit between the first and second initial checkpoints and the at least third final checkpoint; and
(p) comparing the net cost and benefit of the at least one additional optimization procedure with the optimization procedure that gave the best net cost and benefit of all previous optimization procedures and retaining the final checkpoint and change in the design from the optimization procedure that gives the best net cost and benefit.

11. The method of claim 10 further comprising the step of:
(q) recursively repeating steps (d) to (p).

12. The method of claim 1 wherein the step of evaluating the at least one design change is performed by incrementally analyzing only the design change caused by the optimization procedure.

13. The method of claim 1 further comprising the steps of:
(f) applying the first optimization procedure at least a second time to cause at least one change in the design; and
evaluating the at least one design change from applying the first optimization procedure at least a second time to determine the net cost and benefit of the change.

14. The method of claim 1 further comprising the steps of:
(f) applying a second optimization procedure to cause at least one change in the design;
(g) establishing a second final checkpoint after applying the second optimization procedure, the step of evaluating determining the net cost and benefit between the first final checkpoint and the second final checkpoint;
(h) retaining the second final checkpoint and change in the design if a beneficial result is obtained over the first final checkpoint, otherwise returning to the first initial checkpoint.

15. The method of claim 2 further comprising the steps of:
(h) retaining the first initial checkpoint;
(i) applying a further optimization procedure to cause at least one change in the design;
(j) establishing a final checkpoint for the further optimization procedure, the step of evaluating determining the net cost/benefit between the final checkpoint of the further optimization procedure and a previous retained final checkpoint;
(k) retaining the final checkpoint for the further optimization procedure if there is a net cost/benefit over the previous retained final checkpoint, otherwise retaining the previous retained final checkpoint; and
(l) repeating steps (i) to (k) for each additional optimization applied.

16. The method of claim 1 wherein the method is applied to optimizing a circuit design having a plurality of slacks, one of which is the worst slack, and wherein the net cost and benefit of the at least one design change is improved if there is a decrease in the size of the circuit or an improvement in the worst slack of the circuit.

17. The method of claim 16 wherein the circuit design is optimized during logic synthesis.

18. A method for analyzing and optimizing a design, the method comprising the steps of:
  (a) providing a model representing a design being optimized;
  (b) providing a checkpoint manager for recording and reversing changes of the design between selected reference points, the selected reference points being an initial checkpoint and a final checkpoint;
  (c) providing an evaluator for determining the net cost and benefit of the changes between the selected reference points;
  (d) establishing an initial checkpoint;
  (e) applying an optimization procedure to cause at least one change in the design from the initial checkpoint to a second checkpoint;
  (f) evaluating the at least one design change resulting from the optimization procedure to determine the net cost and benefit of the change;
  (g) returning the design model to the initial checkpoint;
  (h) repeating steps (d), (e) and (f);
  (i) comparing the net cost and benefit of the optimization procedure just performed with the best net cost and benefit of any previous optimization procedure performed to result in a best net cost and benefit of the optimization procedures just performed and previously performed, and retaining the best net cost and benefit of the optimization procedures just performed and previously performed;
  (j) returning the design model to the initial checkpoint;
  (k) repeating steps (g), (h) and (i) a predetermined number of times; and
  (l) returning the design model to its design state at the checkpoint of the optimization procedure that has resulted in the best net cost and benefit or to its design state at the initial checkpoint in the event that no optimization procedure improved the design model so that the design is optimally changed to a new design.

19. The method of claim 18 wherein the step of evaluating comprises the following steps in the specified order:
  (f1) evaluating at least one design parameter of the at least one design change at the second checkpoint to obtain a first evaluation result;
  (f2) returning the design model to the initial checkpoint;
  (f3) evaluating the at least one design parameter at the initial checkpoint to obtain a second evaluation result; and
  (f4) comparing the first and second evaluation results to determine the net cost and benefit of the at least one design change.

20. The method of claim 18 wherein steps (d) to (l) are performed in the order specified in claim 18.

21. The method of claim 18 wherein the step of evaluating the at least one design change is performed by incrementally analyzing only the design change caused by the optimization procedure.

22. The method of claim 18 wherein the method is applied to optimizing a circuit design and wherein the net cost and benefit of the at least one design change is improved if there is a decrease in the size of the circuit or an improvement in the worst slack of the circuit.

23. The method of claim 22 wherein the circuit design is optimized during logic synthesis.

24. A method for analyzing and optimizing a design, the method comprising the steps of:
  (a) providing a model representing a design being optimized;
  (b) providing a checkpoint manager for recording and reversing changes of the design between selected checkpoint reference points;
  (c) providing an evaluator for determining the net cost and benefit of the changes between the selected reference points;
  (d) establishing and retaining a checkpoint;
  (e) applying an optimization procedure to cause at least one change in the design from the previously retained checkpoint in step (d) to a final checkpoint;
  (f) evaluating the at least one design change resulting from the optimization procedure to determine the net cost and benefit of the change;
  (g) comparing the net cost and benefit of the optimization procedure just performed with the net cost and benefit of the previous optimization procedure performed associated with the previous retained checkpoint, and retaining the best net cost and benefit and final checkpoint of the optimization procedure just performed if there is an improved net cost and benefit;
  (h) returning the design model to the immediately previous retained checkpoint;
  (i) repeating steps (e) to (h) a predetermined number of times; and
  (j) returning the design model to its state at the checkpoint of the optimization procedure that has resulted in the last net cost and benefit retained or to its state at the initial checkpoint in the event that no optimization procedure improved the design model so that the design is optimally changed to a new design.

25. The method of claim 24 wherein the step of evaluating comprises the following steps in the specified order:
  (f1) evaluating at least one design parameter of the at least one design change at the final checkpoint to obtain a first evaluation result;
  (f2) returning the design model to the immediately previous retained checkpoint;
  (f3) evaluating the at least one design parameter at the immediately previous retained checkpoint to obtain a second evaluation result; and
  (f4) comparing the first and second evaluation results to determine the net cost and benefit of the at least one design change.

26. The method of claim 24 wherein steps (d) to (j) are performed in the order specified in claim 24.

27. The method of claim 24 wherein the step of evaluating the at least one design change is performed by incrementally analyzing only the design change caused by the optimization procedure.

28. The method of claim 24 wherein the method is applied to optimizing a circuit design having a plurality of slacks, one of which is the worst slack, and wherein the net cost and benefit of the at least one design change is improved if there is a decrease in the size of the circuit or an improvement in the worst slack of the circuit.

29. The method of claim 28 wherein the circuit design is optimized during logic synthesis.

30. A computer program product comprising:
  a computer usable medium having computer readable program code means embodied therein for causing a design to be analyzed and optimized, the computer readable program code means in the computer program product comprising:

(a) computer readable program code means for causing a computer to effect a model representing a design being optimized;

(b) computer readable program code means for causing a computer to effect a checkpoint manager for recording and reversing changes of the design between selected reference points, the selected reference points being an initial checkpoint and a final checkpoint;

(c) computer readable program code means for causing a computer to effect an evaluator for determining the net cost and benefit of the changes between the selected reference points;

(d) computer readable program code means for causing a computer to effect the application of a first optimization procedure to cause at least one change in the design; and (e) computer readable program code means for causing a computer to effect the evaluation of the at least one design change to determine the net cost and benefit of the change, wherein if the at least one design change results in improved net cost and benefit, then the design is optimized.

31. The computer program product of claim 30 further comprising:

(f) computer readable program code means for causing a computer to effect the establishment of a first initial checkpoint; and (g) computer readable program code means for causing a computer to effect the establishment of a first final checkpoint after the application of the first optimization procedure, the evaluation of the at least one design change determining the net cost and benefit between the first initial and first final checkpoints.

32. The computer program product of claim 31 further comprising:

(h) computer readable program code means for causing a computer to effect the establishment of a second initial checkpoint;

(i) computer readable program code means for causing a computer to effect the application of a second optimization procedure to cause at least one change in the design; and (j) computer readable program code means for causing a computer to effect the establishment of a second final checkpoint after the application of the second optimization procedure, the evaluation of the at least one design change determining the net cost and benefit between the second initial and second final checkpoints.

33. The computer program product of claim 32 further comprising:

(k) computer readable program code means for causing a computer to effect the comparison of the net cost and benefits of the first and second optimization procedures and the retention of the final checkpoint and change in the design from the optimization procedure that gives the best net cost and benefit.

34. A computer program product comprising:

a computer usable medium having computer readable program code means embodied therein for causing a design to be analyzed and optimized, the computer readable program code means in the computer program product comprising:

(a) computer readable program code means for causing a computer to effect a model representing a design being optimized;

(b) computer readable program code means for causing a computer to effect a checkpoint manager for recording and reversing changes of the design between selected reference points, the selected reference points being an initial checkpoint and a final checkpoint;

(c) computer readable program code means for causing a computer to effect an evaluator for determining the net cost and benefit of the changes between the selected reference points;

(d) computer readable program code means for causing a computer to effect the establishment of an initial checkpoint;

(e) computer readable program code means for causing a computer to effect the application of a first optimization procedure to cause at least one change in the design from the initial checkpoint to a second checkpoint;

(f) computer readable program code means for causing a computer to effect the evaluating the at least one design change resulting from the optimization procedure in step (e) to determine the net cost and benefit of the change;

(g) computer readable program code means for causing a computer to effect the return of the design model to the initial checkpoint;

(h) computer readable program code means for causing a computer to effect the repetition of steps (d), (e) and (f);

(i) computer readable program code means for causing a computer to effect the comparison of the net cost and benefit of the optimization procedure just performed with the best net cost and benefit of any previous optimization procedure performed to result in a best net cost and benefit of the optimization procedures just performed and previously performed, and the retention of the best net cost and benefit of the optimization procedures just performed and previously performed;

(j) computer readable program code means for causing a computer to effect the return of the design model to the initial checkpoint;

(k) computer readable program code means for causing a computer to effect the repetition of steps (g), (h) and (i) a predetermined number of times; and (l) computer readable program code means for causing a computer to effect the returning of the design model to its state at the checkpoint of the optimization procedure that has resulted in the best net cost and benefit or to its state at the initial checkpoint in the event that no optimization procedure improved the design model so that the design is optimally changed to a new design.

35. A computer program product comprising:

a computer usable medium having computer readable program code means embodied therein for causing a design to be analyzed and optimized, the computer readable program code means in the computer program product comprising:

(a) computer readable program code means for causing a computer to effect a model representing a design being optimized;

(b) computer readable program code means for causing a computer to effect a checkpoint manager for recording and reversing changes of the design between selected reference points;

(c) computer readable program code means for causing a computer to effect an evaluator for determining the net cost and benefit of the changes between the selected reference points;

(d) computer readable program code means for causing a computer to effect the establishment and retention of a checkpoint;

(e) computer readable program code means for causing a computer to effect the application of an optimization procedure to cause at least one change in the design from the previously retained checkpoint to a final checkpoint;

(f) computer readable program code means for causing a computer to effect the evaluation of the at least one design change resulting from the optimization procedure to determine the net cost and benefit of the change;

(g) computer readable program code means for causing a computer to effect the comparison of the net cost and benefit of the optimization procedure just performed with the net cost and benefit of the previous optimization procedure performed associated with the previous retained checkpoint, and the retention of the best net cost and benefit and final checkpoint of the optimization procedure just performed if there is an improved net cost and benefit;

(h) computer readable program code means for causing a computer to effect the return of the design model to the immediately previous retained checkpoint;

(i) computer readable program code means for causing a computer to effect the repetition of steps (e) and (h) a predetermined number of times; and (i) computer readable program code means for causing a computer to effect the returning of the design model to its state at the checkpoint of the optimization procedure that has resulted in the last net cost and benefit retained or to its state at the initial checkpoint in the event that no optimization procedure improved the design model so that the design is optimally changed to a new design.

36. A program storage device readable by a machine, tangibly embodying a program of instructions executable by the machine to perform method steps for analyzing and optimizing a design, the method steps comprising the steps of:

(a) providing a model representing a design being optimized;

(b) providing a checkpoint manager for recording changes of the design between selected reference points, the selected reference points being an initial checkpoint and a final checkpoint;

(c) providing an evaluator for determining the net cost and benefit of the changes between the selected reference points;

(d) applying a first optimization procedure to cause at least one change in the design; and (e) evaluating the at least one design change to determine the net cost and benefit of the change, thereby determining if the design change will result in an optimized design.

37. The program storage device of claim 36 wherein the method further comprising the steps of:

(f) establishing a first initial checkpoint; and (g) establishing a first final checkpoint after applying the first optimization procedure, the step of evaluating determining the net cost and benefit between the first initial and first final checkpoints.

38. The program storage device of claim 37 wherein the method further comprising the steps of:

(h) establishing a second initial checkpoint;

(i) applying a second optimization procedure to cause at least one change in the design; and (j) establishing a second final checkpoint after applying the second optimization procedure, the step of evaluating determining the net cost and benefit between the second initial and second final checkpoints.

39. The program storage device of claim 38 wherein the method further comprising the step of:

(k) comparing the net cost and benefits of the first and second optimization procedures and retaining the final checkpoint and change in the design from the optimization procedure that gives the best net cost and benefit.

40. A program storage device readable by a machine, tangibly embodying a program of instructions executable by the machine to perform method steps for analyzing and optimizing a design, the method steps comprising the steps of:

(a) providing a model representing a design being optimized;

(b) providing a checkpoint manager for recording changes of the design between selected reference points, the selected reference points being an initial checkpoint and a final checkpoint;

(c) providing an evaluator for determining the net cost and benefit of the changes between the selected reference points;

(d) establishing an initial checkpoint;

(e) applying an optimization procedure to cause at least one change in the design from the initial checkpoint to a second checkpoint;

(f) evaluating the at least one design change resulting from the optimization procedure to determine the net cost and benefit of the change;

(g) returning the design model to the initial checkpoint;

(h) repeating steps (d), (e) and (f);

(i) comparing the net cost and benefit of the optimization procedure just performed with the best net cost and benefit of any previous optimization procedure performed to result in a best net cost and benefit of the optimization procedures performed thus far, and retaining the best net cost and benefit of the optimization procedures performed thus far;

(j) returning the design model to the initial checkpoint;

(k) repeating steps (g), (h) and (i) a predetermined number of times; and (l) returning the design model to its state at the checkpoint of the optimization procedure that has resulted in the best net cost and benefit or to its state at the initial checkpoint in the event that no optimization procedure improved the design model so that the design is optimally changed to a new design.

41. A program storage device readable by a machine, tangibly embodying a program of instructions executable by the machine to perform method steps for analyzing and optimizing a design, a method for analyzing and optimizing a design, the method steps comprising the steps of:

(a) providing a model representing a design being optimized;

(b) providing a checkpoint manager for recording and reversing changes of the design between selected checkpoint reference points;

(c) providing an evaluator for determining the net cost and benefit of the changes between the selected reference points;

(d) establishing and retaining a checkpoint;

(e) applying an optimization procedure to cause at least one change in the design from the previously retained checkpoint in step (d) to a final checkpoint;

(f) evaluating the at least one design change resulting from the optimization procedure to determine the net cost and benefit of the change;

(g) comparing the net cost and benefit of the optimization procedure just performed with the net cost and benefit of the previous optimization procedure performed associated with the previous retained checkpoint, and retaining the best net cost and benefit and final checkpoint of the optimization procedure just performed if there is an improved net cost and benefit;

(h) returning the design model to an immediately previous retained checkpoint;

(i) repeating steps (e) to (h) a predetermined number of times; and (j) returning the design model to its state at the checkpoint of the optimization procedure that has resulted in the last net cost and benefit retained or to its state at the initial checkpoint in the event that no optimization procedure improved the design model so that the design is optimally changed to a new design.

* * * * *